United States Patent [19]

Chen et al.

[11] Patent Number: 5,506,167
[45] Date of Patent: Apr. 9, 1996

[54] METHOD OF MAKING A HIGH RESISTANCE DRAIN JUNCTION RESISTOR IN A SRAM

[75] Inventors: Hwi-Huang Chen, Taipei; Gary Hong, Hsin-Chu, both of Taiwan

[73] Assignee: United Microelectronics Corp., Hsin-Chu, Taiwan

[21] Appl. No.: 421,000

[22] Filed: Apr. 13, 1995

[51] Int. Cl.⁶ .................................................. H01L 21/70
[52] U.S. Cl. ................................ 437/60; 437/24; 437/40; 437/41; 437/918
[58] Field of Search ...................... 437/918, 60, 41 AS, 437/24, 40 AS

[56] References Cited

U.S. PATENT DOCUMENTS

| | | | |
|---|---|---|---|
| 3,925,106 | 12/1975 | Ku et al. | 437/24 |
| 4,868,618 | 9/1989 | Kalnitsky et al. | 257/314 |
| 4,965,214 | 10/1990 | Choi et al. | 437/918 |
| 5,200,356 | 4/1993 | Tanaka | 437/60 |

FOREIGN PATENT DOCUMENTS

| | | |
|---|---|---|
| 0236150 | 10/1986 | Japan . |
| 0058864 | 3/1988 | Japan . |

*Primary Examiner*—Brian E. Hearn
*Assistant Examiner*—Trung Dang
*Attorney, Agent, or Firm*—Barnes, Kisselle, Raisch, Choate, et al.

[57] ABSTRACT

An improved SRAM resistor structure having implanted therein ions of an material in the surface layer of a drain junction region juxtaposed to an overlying metal contact layer providing the benefits of high resistance, low energy consumption, a single ion implantation step in an easily controlled process while producing a precise resistance desired and a method of making the SRAM resistor structure.

6 Claims, 2 Drawing Sheets

METHOD OF MAKING A HIGH RESISTANCE DRAIN JUNCTION RESISTOR IN A SRAM

FIELD OF THE INVENTION

The present invention generally relates to a new resistor structure in a four-transistor SRAM and more particularly relates to a new resistor structure in a four-transistor SRAM made by an implantation process to form an amorphous material.

BACKGROUND OF THE INVENTION

In a conventional SRAM, a high resistance drain junction resistor must be formed by a multiplicity of processing steps using polycrystaline silicon. It is not only a complicated process, but also a very difficult process for controlling the exact magnitude of resistance obtained.

The structure of a conventional SRAM 10 is shown in FIG. 1, wherein a static memory cell is constructed with four-transistors. The gate junctions and the drain junctions are connected together in a corresponding pair of transistors 12 and 14. Each of the drain junctions of transistors 12 and 14 is connected in series with a high resistance drain junction resistor 16 and 18. Word line WL and WL' are connected to the control transistors 20 and 22 to form a static memory cell. During the manufacturing process of the drain junction resistors 16 and 18 of the memory cell, polycrystaline silicon material is used as the poly load for its high resistance and space-saving features. In order to form a resistor by the polycrystaline silicon process, at least four processing steps are required, deposition step, a poly 2 implantation step and a poly 2 etch step. These processing steps leads to a complicated and difficult to control manufacturing process. Furthermore, the process frequently produces a resistance that easily drifts away from its desired value and the process is difficult to precisely control. It is therefore desirable to provide an improved method to overcome these difficulties.

It is therefore an object of tile present invention to provide a method of forming a resistor in a four-transistor SRAM that does not have the shortcomings of the prior art methods.

It is another object of the present invention to provide an improved method of forming a resistor in a four-transistor SRAM that does not require multiple processing steps.

It is a further object of the present invention to provide an improved method to form a resistor structure in a four-transistor SRAM that does not require the formation of a drain junction resistor by polycrystaline silicon.

It is yet another object of the present invention to provide an improved method of forming a resistor structure in a four-transistor SRAM that only requires a photoresist process for implantation and an implantation step to form amorphous silicon in the surface layer at the drain junction.

It is another further object of the present invention to provide an improved method of forming a resistor structure in a four-transistor SRAM by implanting silicon or argon into the surface layer of the drain junction such that a high resistance drain junction resistor is formed between the drain junction and the metal contact region.

SUMMARY OF THE INVENTION

In accordance with the present invention, an improved method of forming a resistor structure in a four-transistor SRAM without polysilicon implantation and can be accomplished in one processing step is provided.

In the preferred embodiment, the present invention improved method is carried out by implanting argon or silicon into the drain junction region using a photomasking method before the deposition step of the metal layer. A high resistance drain junction resistor is formed between the drain junction and the metal contact region. The method greatly simplifies the manufacturing process for a drain junction resistor such that the process can be easily controlled and applied in the manufacturing of an extremely low power consumption SRAM.

The implantation of the silicon or argon can be carried out before the metal deposition step at the source/drain junction region. The implantation process of silicon or argon transforms the surface layer near the drain junction region into an amorphous region having high resistance. The drain junction resistor is formed directly in this simplified manufacturing process which can be easily controlled. The improved method therefore provides a greatly simplified manufacturing process for SRAM and other similar structure.

The present invention is further directed to an SRAM structure that has a high resistance resistor at the drain junction region formed by the implantation of silicon or argon. The SRAM can be manufactured by a simplified process and therefore at a lower manufacturing cost than those made by the conventional methods which require multiple processing steps.

BRIEF DESCRIPTION OF THE DRAWINGS

Other objects, features and advantages of the present invention will become apparent upon consideration of the specification and the appended drawings, in which.

DETAILED DESCRIPTION OF THE PREFERRED EMBODIMENT

The present invention provides a method of forming a high drain junction resistor in a SRAM by the implantation of argon or silicon. The improved process only requires a photomasking process on the drain junction region to implant argon or silicon before the deposition of a metal contact layer in the source/drain junction area. The implantation process transforms the surface layer at the drain junction region into a high resistance amorphous layer to form a high resistance drain junction resistor. The present invention provides a greatly simplified manufacturing process, and furthermore, enables an easy control of the drain junction resistance such that a SRAM can be advantageously manufactured.

Figures 1, 2, 3:
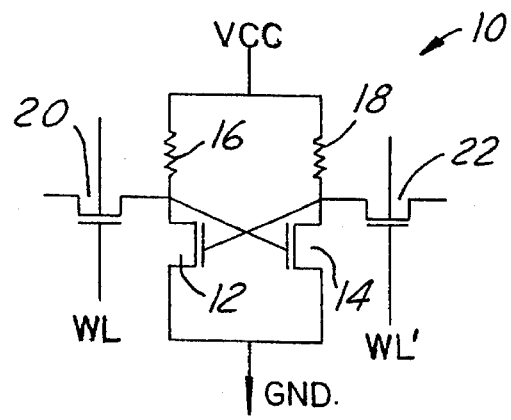
FIG. 1 is an equivalent circuit diagram of a convention SRAM.
FIG. 2 is an equivalent circuit diagram of the present invention SRAM.
FIG. 3 is an enlarged cross-sectional view of the component shown in FIG. 2.

Referring initially to FIG. 2, where a circuit diagram of an equivalent circuit 30 of the present invention is shown. Equivalent circuit 30 comprises four-transistors 32, 34, 36, and 38 forming a present invention SRAM structure. The difference between the equivalent circuit 30 and that of a conventional SRAM is shown in the two blocks 52 and 54 drawn in dashed lines. The high resistance resistors 40 and 42 connected in series to the drain junctions of transistors 32 and 34 are formed directly at the drain junction area on transistors 32 and 34.

FIG. 3 is an enlarged cross-sectional view of a present invention SRAM corresponding to that shown in FIG. 2. A gate polysilicon 56, an $n^+$ source junction 58 and an $n^+$ drain junction 60 form a MOS transistor 32 having in the surface layer resistor 40 formed by an amorphous material. A metal contact layer 42 is then deposited on top of the $n^+$ source junction and the $n^+$ drain junction to facilitate external connections. A circuit is therefore formed as that shown in FIG. 2. A high resistance resistor 40 is formed on transistor 32 between the drain junction 60 and the metal contact 42. The high resistance drain junction resistor 40 formed by the amorphous material requires only a single implantation step to be formed which eliminates multiple processing steps required in a conventional method of making a polysilicon equivalent resistor. The present invention process therefore not only simplifies a manufacturing process, but also enables more precise control of the resistance formed. The manufacturing tolerance of the desired resistance value is greatly reduced. The power consumption of the SRAM is also reduced based on the high resistance of the resistors.

Figure 4A:
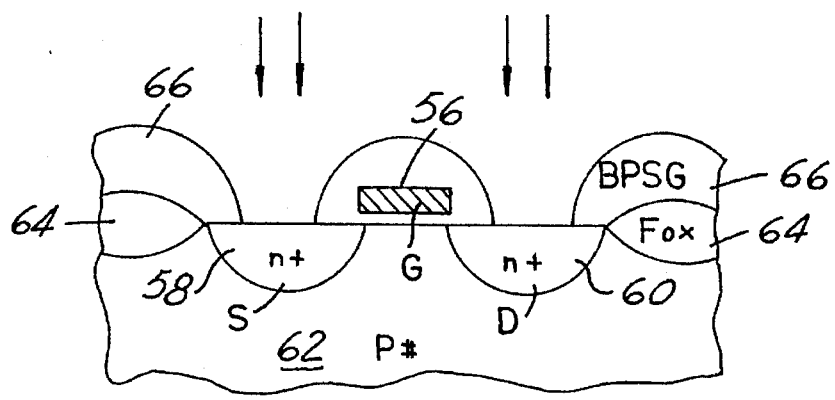
FIGS. 4A–4C are enlarged cross-sectional views of the component of the present invention SRAM in consecutive manufacturing steps.
Figure 4B:
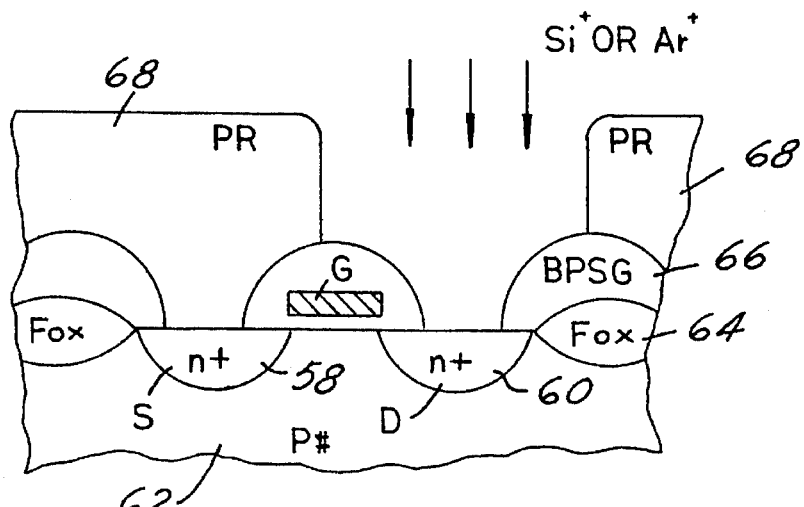
Figure 4C:
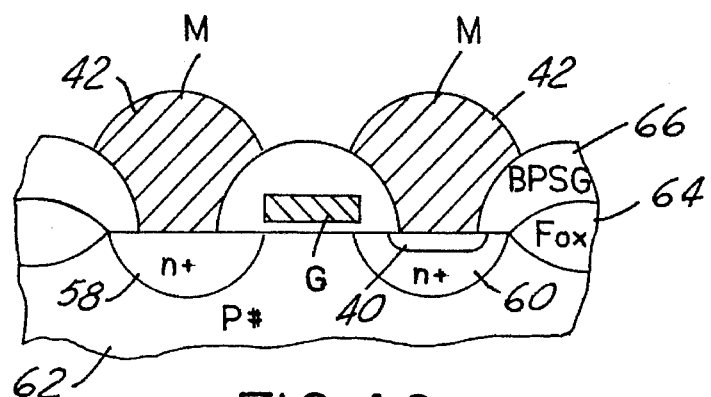

The processing steps of the present invention method of making a drain junction resistor is shown in FIGS. 4A–C. In FIG. 4A, an insulating layer 64 of field oxide is formed on top of the silicon base 62. A gate 56 of polysilicon and polycide ($WSi_x$) is then formed. An $n^+$ source junction 58 and a drain junction 60 are formed at the P well on silicon base 62, followed by the deposition of a dielectric layer 66 of BPSG (boron phosphorus silicate glass). A series of subsequent processing steps such as a contact region photomasking/etching step, a photoresist removal step, a plug photomasking step, a plug implantation step, a photoresist removal step and a plug region annealing step are then carried out.

As shown in FIG. 4B, a photomask 68 for the argon or silicon implantation process is carried out on top of the silicon base 62 such that the desirable areas are covered by the photoresist with only the drain junction region 60 exposed. An implantation step can then be carried out by using either Si ions or Ar ions. The implantation energy level and the dosage of the ions are approximately 80 KeV and $1 \times 10^{16}/cm^2$. The implantation process enables the surface layer of the drain junction region 60 to form an amorphous material and, subsequently a high resistance drain junction resistor 40. This is shown in FIG. 4C.

After the completion of the ion implantation process, the photomasking layer 68 shown in FIG. 4B is then removed. A metal contact layer 42 is subsequently deposited by carrying out the steps of metal contact photomasking, etching, photoresist removal and alloying. An SRAM having a high resistance drain junction resistor as that shown in the enlarged cross-sectional view of FIG. 3 is accomplished.

The processing steps for the present invention implantation process to form amorphous silicon can be summarized as follows:
1. Contact masking
2. Contact etch
3. Photoresist removal
4. Plug masking
5. Plug implantation
6. Photoresist removal
7. Plug annealing
8. Amorphous implantation masking
9. Silicon or argon implantation
10. Photoresist removal
11. Metal deposition
12. Metal masking
13. Metal etching
14. Photoresist
15. Alloying The resistance of the drain junction resistor formed by the present invention silicon or argon implantation process can be controlled by the implantation dosage. It can be easily and precisely controlled compared to that of a polysilicon deposition/etching/implantation process used in the conventional method. Furthermore, the present invention is especially suitable in the manufacturing of an extremely low power consumption SRAM.

The present invention improves the conventional method of manufacturing a drain junction resistor by requiring only a single step implantation process such that a high resistance resistor can be formed directly on the drain junction region. It enables a much simplified manufacturing process to be conducted and furthermore, it allows the saving of surface areas occupied by a resistor, which in turn allows the saving of space occupied by a memory component.

While the present invention has been described in an illustrative manner, it should be understood that the terminology used is intended to be in the nature of words of description rather than of limitation.

Furthermore, while the present invention has been described in terms of a preferred embodiment thereof, it is to be appreciated that those skilled in the art will readily apply these teachings to other possible variations of the invention. For instance, other ions than silicon and argon may also be suitably used in the implantation process to form amorphous material in the present invention while achieving substantially the same desirable results.

The embodiments of the invention in which an exclusive property or privilege are claimed are defined as follows:

1. A method of making a high resistance drain junction resistor on an SRAM chip by an implantation process comprising the steps of:

providing a semiconductor substrate having a source junction region, a drain junction region and a gate region, photomasking and etching for an insulating layer and a contact region, photomasking for an implantation such that a photoresist layer covers regions outside of the drain junction, implanting ions of a material into the drain junction region at a suitable energy and dosage level to form a high resistance drain junction resistor, and removing the photoresist.

2. A method according to claim 1 further comprises after said photoresist removal step, a metal layer deposition step, a photomasking step, an etching step, a photoresist removal step and an alloying step.

3. A method according to claim 1, wherein said material implanted is Si ion.

4. A method according to claim 1, wherein said material implanted is Ar ion.

5. A method according to claim 1, wherein said material is implanted at an energy level between about 60 KeV to about 100 KeV.

6. A method according to claim 1, wherein said material is implanted at a dosage between about $0.5 \times 10^{16}/cm^2$ and about $5 \times 10^{16}/cm^2$.

* * * * *